United States Patent
Kim

(10) Patent No.: US 9,870,992 B1
(45) Date of Patent: Jan. 16, 2018

(54) POWER LINE LAYOUT STRUCTURE FOR SEMICONDUCTOR DEVICE

(71) Applicant: SK hynix Inc., Icheon-si, Gyeonggi-do (KR)

(72) Inventor: Jae Hwan Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/483,608

(22) Filed: Apr. 10, 2017

(30) Foreign Application Priority Data

Jul. 19, 2016 (KR) .................. 10-2016-0091253

(51) Int. Cl.
*H01L 23/528* (2006.01)
*H01L 27/108* (2006.01)

(52) U.S. Cl.
CPC .......... *H01L 23/528* (2013.01); *H01L 27/108* (2013.01)

(58) Field of Classification Search
CPC ............................. H01L 23/528; H01L 27/108
See application file for complete search history.

(56) References Cited

U.S. PATENT DOCUMENTS

2010/0237508 A1* 9/2010 Utsumi ............... H01L 23/5286
257/774
2013/0328210 A1 12/2013 Shim

FOREIGN PATENT DOCUMENTS

KR 1020130137955 A 12/2013

* cited by examiner

*Primary Examiner* — David Vu
(74) *Attorney, Agent, or Firm* — William Park & Associates Ltd.

(57) ABSTRACT

A power line layout structure of the semiconductor device may include first through fifth power lines. The first and second power lines may be located at a first layer, and may provide different types of power-supply voltages. The third power line may be located at a second layer disposed at a level different from that of the first layer. The third power line may be coupled to the first power line through a first contact, and may extend in the same direction as the first power line. The fourth power line may be located at the second layer, and may be coupled to the second power line through a second contact. The fourth power line may extend in the same direction as the second power line. The fifth power line may be disposed between the first power line and the second power line in the first layer.

17 Claims, 3 Drawing Sheets

POWER LINE LAYOUT STRUCTURE FOR SEMICONDUCTOR DEVICE

CROSS-REFERENCE TO RELATED APPLICATION

The present application claims priority under 35 U.S.C 119(a) to Korean patent application number 10-2016-0091253 filed on 19 Jul. 2016, the disclosure of which is hereby incorporated by reference in its entirety.

BACKGROUND

Embodiments of the present disclosure generally relate to a semiconductor device, and more particularly to a power line layout structure for more efficiently arranging power lines located at a plurality of metal layers in a semiconductor device.

In manufacturing highly integrated, low-power semiconductor devices, an interconnect size and a spacing between adjacent interconnects in the semiconductor devices are becoming very important factors.

Interconnects distribute a variety of signals and provide a variety of levels of power to the semiconductor devices, which means that a semiconductor device has various types of interconnects.

However, it is difficult to effectively arrange such various types of interconnects in a limited area.

SUMMARY

In accordance with an aspect of the present disclosure, a power line layout structure of a semiconductor device may include first through fifth power lines. The first and second power lines may be located at a first layer, and may provide different types of power-supply voltages. The third power line may be located at a second layer disposed at a level different from that of the first layer. The third power line may be coupled to the first power line through a first contact, and may extend in the same direction as the first power line. The fourth power line may be located at the second layer, and may be coupled to the second power line through a second contact. The fourth power line may extend in the same direction as the second power line. The fifth power line may be disposed between the first power line and the second power line in the first layer.

A power line layout structure in accordance with an embodiment may include two or more power lines providing the same type of power-supply voltages. The two or more power lines may be disposed at different levels and extend in the same direction. At least one of the two or more power lines is narrower in width than another power line disposed at an adjacent level. The power line layout structure in accordance with an embodiment may include another power line providing a power supply voltage different from those the two or more power lines provide. The another power line may be disposed next to the at least one of the power lines at the same level as the at least one of the two or more first power lines.

It is to be understood that both the foregoing general description and the following detailed description are provided as example embodiments.

DETAILED DESCRIPTION

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein will be omitted when it may make the subject matter less clear.

Figure 1:
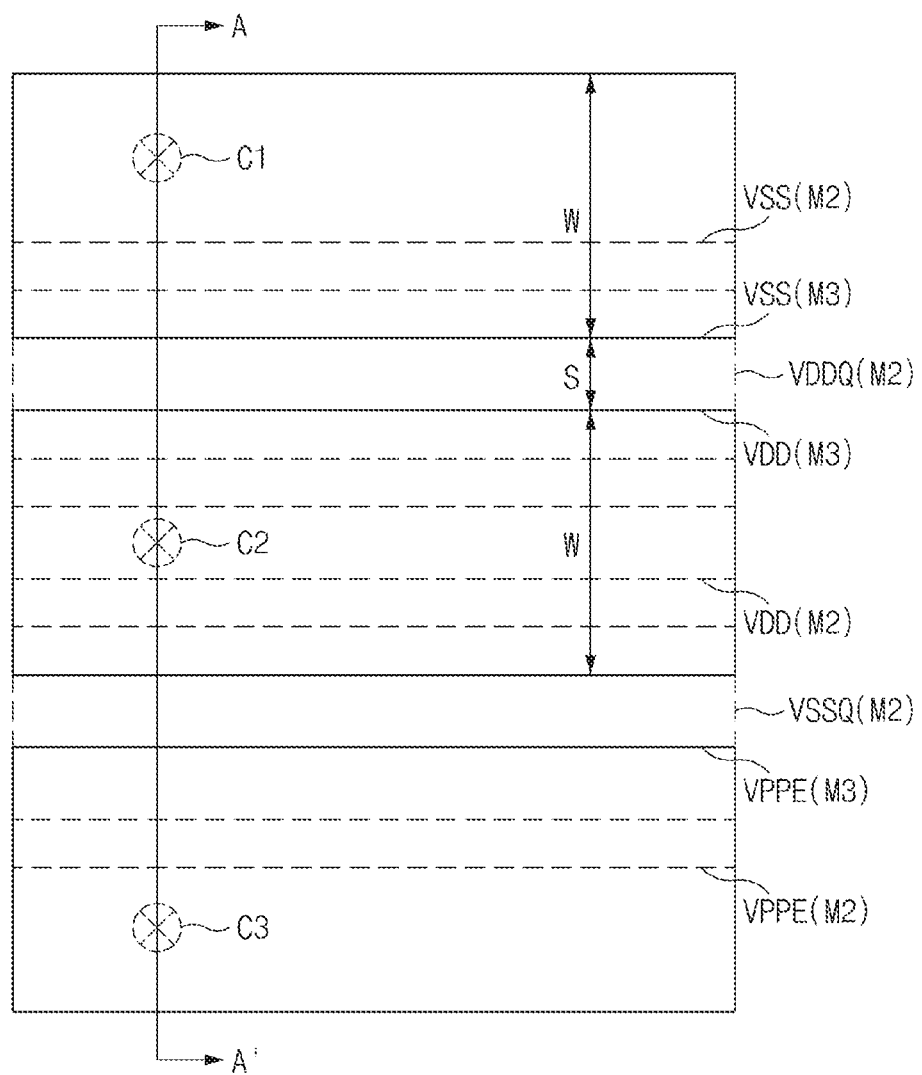
FIG. 1 is a plan view illustrating an example of a power line layout structure of a semiconductor device according to an embodiment of the present disclosure.
Figure 2:
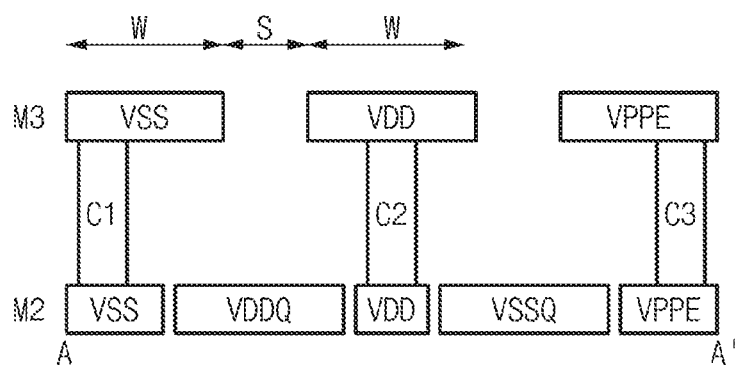
FIG. 2 is a cross-sectional view illustrating the semiconductor device taken along the line A-A' of FIG. 1.

FIG. 1 is a plan view illustrating an example of a power line layout structure of a semiconductor device according to an embodiment of the present disclosure. FIG. 2 is a cross-sectional view illustrating the semiconductor device taken along the line A-A' of FIG. 1.

FIGS. 1 and 2 illustrates an example in which power lines are formed in each of a second metal layer M2 and a third metal layer M3.

The second metal layer M2 may include a plurality of power lines, for example, a first ground voltage line VSS (M2), a first power-supply voltage line VDD (M2), a second power-supply voltage line VDDQ (M2), a second ground voltage power VSSQ (M2), and a pumping voltage line VPPE (M2).

A third metal layer M3 may include a plurality of power lines, for example, a first ground voltage line VSS (M3), a first power-supply line VDD (M3), and a pumping voltage line VPPE (M3). In this case, the first ground voltage line VSS (M3), the first power-supply voltage line VDD (M3), and the pumping voltage line VPPE (M3) located at the third metal layer M3 may have the same line width W as one another, and a spacing S between adjacent lines may be the same as one another.

The same type of power lines formed in the second metal layer M2 and the third metal layer M3 may be coupled to each other through contacts C1, C2, and C3. In other words, the first ground voltage line VSS (M2) formed in the second metal layer M2 and the first ground voltage line VSS (M3) formed in the third metal layer M3 may be coupled to each other through the contact C1. The first power-supply voltage line VDD (M2) formed in the second metal layer M2 and the first power-supply voltage line VDD (M3) formed in the third metal layer M3 may be coupled to each other through the contact C2. The pumping voltage line VPPE (M2) formed in the second metal layer M2 and the pumping voltage line VPPE (M3) formed in the third metal layer M3 may be coupled to each other through the contact C3.

In this case, power lines in the second metal layer M2 and the third metal layer M3 may be arranged in the same direction. In more detail, the first ground voltage line VSS (M2) of the second metal layer M2 and the first ground voltage line VSS (M3) of the third metal layer M3 may be arranged in the same direction. The first power-supply voltage line VDD (M2) of the second metal layer M2 and the first power-supply voltage line VDD (M3) of the third metal layer M3 may be arranged in the same direction. The pumping voltage line VPPE (M2) of the second metal layer M2 and the pumping voltage line VPPE (M3) of the third metal layer M3 may be arranged in the same direction.

However, among power lines interconnected through the contact C1, C2, and C3, line widths (W) of power lines formed in the second metal layer M2 may be different from line widths (W) of power lines formed in the third metal layer M3. For example, as illustrated in FIGS. 1 and 2, the first ground voltage line VSS (M2), the first power-supply voltage line VDD (M2), and the pumping voltage line VPPE (M2) formed in the second metal layer M2 may be smaller in line width than the first ground voltage line VSS (M3), the first power-supply voltage line VDD (M3), and the pumping voltage line VPPE (M3) formed in the third metal layer M3, respectively. Alternatively, power lines formed in the third metal layer M3 may be smaller in line width than power lines formed in the second metal layer M3.

In an embodiment, the same type of power lines interconnected through the contact C1, C2 or C3 and formed in the second metal layer M2 and the third metal layer M3 may be arranged in the same direction as each other, and the same type of power lines in the second metal layer M2 and the third metal layer M3 may have different line widths from each other.

Referring to FIGS. 1 and 2, power lines VSS (M3), VDD (M3), and VPPE (M3) formed in the third metal layer M3 may have the same line width W as each other, and a spacing S between adjacent power lines (e.g., VSS, VDD, and VPPE) may be the same or substantially the same as one another. In addition, each power line (e.g., VSS, VDD, VPPE) formed in the second metal layer M2 may be smaller in line width than the above power lines formed in the third metal layer M3. For example, the line widths of the power lines (e.g., VSS, VDD, and VPPE) formed in the second metal layer M2 may have a minimum line width needed for connection to the contacts C1, C2, and C3. For example, each power lines (e.g., VSS, VDD, VPPE) formed in the second metal layer M2 may have a line width that is equal to or larger than a diameter of the corresponding contact C1, C2, or C3.

As described above, assuming that the line width of each power line VSS (M2), VDD (M2), or VPPE (M2) of the second metal layer M2 is smaller than the line width of each power line VSS (M3), VDD (M3), or VPPE (M3) of the third metal layer M3, more space between adjacent power lines may become available in the second metal layer M2 compared to that in the third metal layer M3. In an embodiment, different types of power lines that are not coupled to the power lines VSS (M3), VDD (M3), and VPPE (M3) of the third metal layer M3 may be formed in the spaces between adjacent power lines VSS (M2), VDD (M2), and VPPE (M2) of the second metal layer M2.

In this case, when seen from above, the second power-supply voltage line VDDQ (M2) and the second ground voltage line VSSQ (M2) formed in the second metal layer M2 may partially overlap power lines VSS (M3), VDD (M3), and VPPE (M3) of the third metal layer M3. For example, as illustrated in FIG. 2, when seen from above, the second power-supply voltage line VDDQ of the second metal layer M2 may partially overlap the first ground voltage line VSS (M3) and the first power-supply voltage line VDD (M3) of the third metal layer M3. The second ground voltage line VSSQ of the second metal layer M2 may partially overlap the first power-supply voltage line VDD (M3) and the pumping voltage line VPPE (M3) of the third metal layer M3, when seen from above.

Figure 3:
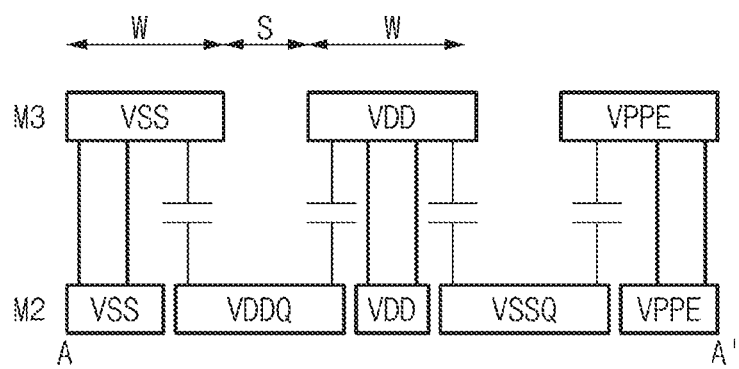
FIG. 3 is a diagram illustrating an example method of forming parasitic capacitance in the semiconductor device illustrated in FIG. 2.

As described above, when seen from above, the second power-supply line VDDQ and the second ground voltage line VSSQ of the second metal layer M2 may overlap the power lines VSS (M3), VDD (M3), VPPE (M3) of the third metal layer M3, such that parasitic capacitance is formed therebetween as illustrated in FIG. 3 to achieve power stabilization. As a result, operation characteristics of the semiconductor device can be improved.

A power line layout structure in accordance with an embodiment may include two or more power lines providing the same type of power-supply voltages. The two or more power lines may be disposed at different levels and extend in the same direction. At least one of the two or more power lines is narrower in width than another power line disposed at an adjacent level. The power line layout structure in accordance with an embodiment may include another power line providing a power supply voltage different from those the two or more power lines provide. The another power line may be disposed next to the at least one of the power lines at the same level as the at least one of the two or more first power lines. Here, the second power line, when seen from above, partially overlaps the another first power line disposed at the adjacent level.

The power line layout structure according to an embodiment may allow a larger number of power lines to be arranged in the semiconductor device without increasing the size thereof.

In addition, the power line layout structure of the semiconductor device in accordance with an embodiment can increase parasitic capacitance between power sources by allowing different power lines to overlap each other. As a result, a power supply for the semiconductor device may be stabilized, and operation characteristics of the semiconductor device may be improved.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

The above embodiments of the present disclosure are illustrative and not limitative. Various alternatives and equivalents are possible. The above embodiments are not limited by the type of deposition, etching polishing, and patterning steps described herein. Nor is the embodiment limited to any specific type of semiconductor device. For example, the present disclosure may be implemented in a dynamic random access memory (DRAM) device or non volatile memory device. Other additions, subtractions, or modifications are obvious in view of the present disclosure and are intended to fall within the scope of the appended claims.

What is claimed is:

1. A power line layout structure for a semiconductor device comprising:
   a first power line and a second power line located at a first layer and providing different types of power-supply voltages;
   a third power line located at a second layer disposed at a level different from that of the first layer, the third power line being coupled to the first power line through a first contact and extending in the same direction as the first power line;
   a fourth power line located at the second layer and coupled to the second power line through a second contact, the fourth power line extending in the same direction as the second power line; and
   a fifth power line disposed between the first power line and the second power line in the first layer.

2. The power line layout structure according to claim 1, wherein the fifth power line is a power-supply line that provides a power-supply voltage different from power-supply voltages the first and second power lines provide.

3. The power line layout structure according to claim 1, wherein the first power line is smaller in line width than the third power line.

4. The power line layout structure according to claim 3, wherein the first power line is located to overlap the third power line when seen from above.

5. The power line layout structure according to claim 1, wherein the second power line is smaller in line width than the fourth power line.

6. The power line layout structure according to claim 5, wherein the second power line is located to overlap the fourth power line when seen from above.

7. The power line layout structure according to claim 1, wherein the fifth power line is located to partially overlap at least one of the third power line and the fourth power line when seen from above.

8. The power line layout structure according to claim 1, wherein the third power line and the fourth power line have the same line width.

9. The power line layout structure according to claim 1, further comprising:
 a sixth power line located at the first layer and providing a power-supply voltage different from power-supply voltages the first power line and the second power line provide;
 a seventh power line located at the second layer and coupled to the sixth power line through a third contact, seventh power line extending in the same direction as the sixth power line;
 an eighth power line disposed between the second power line and the sixth power line in the first layer.

10. The power line layout structure according to claim 9, wherein the eighth power line is a power-supply line that provides a power-supply voltage different from power-supply voltages the second and sixth power lines provide.

11. The power line layout structure according to claim 9, wherein the sixth power line is smaller in line width than the seventh power line.

12. The power line layout structure according to claim 11, wherein the sixth power line is located to overlap the seventh power line when seen from above.

13. The power line layout structure according to claim 9, wherein the eighth power line is located to partially overlap at least one of the fourth power line and the seventh power line when seen from above.

14. The power line layout structure according to claim 9, wherein the seventh power line has the same width as the first power line and the second power line.

15. The power line layout structure according to claim 9, wherein a spacing between the third power line and the fourth power line is identical to a spacing between the fourth power line and the seventh power line.

16. A power line layout structure for a semiconductor device comprising:
 two or more first power lines providing the same type of power-supply voltages, the two or more first power lines being disposed at different levels and extending in the same direction, at least one of the two or more first power lines is narrower in width than another first power line disposed at an adjacent level; and
 a second power line disposed next to the at least one of the two or more first power lines at the same level as the at least one of the two or more first power lines, the second power line providing a power supply voltage different from those the two or more first power lines provide.

17. The power line layout structure according to claim 16, wherein the second power line, when seen from above, partially overlaps the another first power line disposed at the adjacent level.

* * * * *